United States Patent
Wang et al.

(10) Patent No.: US 6,583,489 B2
(45) Date of Patent: Jun. 24, 2003

(54) METHOD FOR FORMING INTERCONNECT STRUCTURE WITH LOW DIELECTRIC CONSTANT

(75) Inventors: Sung-Hsiung Wang, Kaohsiung (TW); Yi-Min Huang, Taichung (TW); Gwo-Shii Yang, Hsin-Chu (TW); Chiung-Sheng Hsiung, Hsin-Chu (TW); Hsueh-Chung Chen, Yung-Ho (TW); Chih-Chien Liu, Taipei (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 10/103,835

(22) Filed: Mar. 25, 2002

(65) Prior Publication Data

US 2002/0155263 A1 Oct. 24, 2002

Related U.S. Application Data

(62) Division of application No. 09/840,715, filed on Apr. 24, 2001, now abandoned.

(51) Int. Cl.[7] .................................................. H01L 29/00
(52) U.S. Cl. ........................ 257/520; 257/505; 257/506; 257/507; 257/508; 257/510
(58) Field of Search ................... 257/505, 506, 257/507, 508, 510, 520

(56) References Cited

U.S. PATENT DOCUMENTS

| | | | | | |
|---|---|---|---|---|---|
| 5,200,639 | A | * | 4/1993 | Ishizuka et al. | 257/514 |
| 5,677,563 | A | * | 10/1997 | Cronin et al. | 257/506 |
| 5,792,706 | A | * | 8/1998 | Michael et al. | 438/626 |
| 6,157,081 | A | * | 12/2000 | Nariman et al. | 257/752 |
| 6,203,863 | B1 | * | 3/2001 | Liu et al. | 427/579 |
| 6,239,018 | B1 | * | 5/2001 | Liu et al. | 438/624 |
| 6,268,280 | B1 | * | 7/2001 | Kohyama | 438/629 |

* cited by examiner

*Primary Examiner*—Cathy Lam

(57) ABSTRACT

The present invention provides a method for forming low dielectric constant inter-metal dielectric layer. The method comprises providing a semiconductor substrate and forming a first dielectric layer on the semiconductor substrate. Conductor structures are formed in the first dielectric layer. The partial first dielectric layer is removed by using the conductor structures as etch mask. A second dielectric layer is formed between the conductor structure, which has a dielectric constant smaller than the first dielectric layer. The semiconductor structure comprises a substrate, a first dielectric layer on the substrate, multitude of conductor structures in the first dielectric layer, and multitude of second dielectric structures in the first dielectric layer and between the conductor structures.

8 Claims, 2 Drawing Sheets

METHOD FOR FORMING INTERCONNECT STRUCTURE WITH LOW DIELECTRIC CONSTANT

This is a divisional application of U.S. application Ser. No. 09/840,715 filed on Apr. 24, 2001, which has been abandoned.

BACKGROUND OF THE INVENTION

1. Field of the Invention

The invention relates to a method and structure for interconnect structure, and more particularly to a method and structure for interconnect structure with low dielectric constant.

2. Description of the Prior Art

It is the nature of semiconductor physics that as the feature sizes are scaled down, the performance the internal devices in integrated circuits improves in a compounded fashion. That is, the device speed as well as the functional capability improves. The overall circuit speed, however, becomes more dependent upon the propagation speed of the signals along the interconnects that connect the various devices together. With the advent of very and ultra large scale integration (VLSI and ULSI) circuits, it has therefore become even more important that the metal conductors that form the interconnections between devices as well as between circuits in a semiconductor have low resistivities for high signal propagation. Copper is often preferred for its low resistivity, as well as for resistance to electromigration and stress voiding properties.

On the other hand, considerable attention has focused on the replacement of silicon dioxide with new materials, particular material having lower dielectric constants, since both capacitive delays and power consumption depend on the dielectric constant of the insulator. Accordingly, circuit performance enhancement has been sought by combining the copper conductors with low dielectric constant insulators (k less than approximately 4).

More recently, in order to further improve device performance, researchers have sought to apply insulative materials with lower dielectric constant than the conventional CVD deposited silicate glasses such as silicon oxide, PSG (phosphosilicate glass) and BPSG (borophosphosilicate glass). Various organic insulator such as parylene, fluorinated polyimides and arylene ether polymers, have been successfully used as low dielectric constant (low-k) replacements for silicon oxide. Porous silica based materials such as siloxanes, silsequioxanes, aerogels, and xerogels have also been implemented as ILD (inter layer dielectric) and IMD (inter-metal dielectric) layers.

However, the spin on dielectric (SOD) materials, like the SOGs and polyimides are extremely sensitive to the methods and conditions by which they are dried and cured after application. Not only are the resultant electrical characteristics of the dielectric layer affected by the drying and curing regimen, but also the physical properties including stress, mechanical strength and physical and chemical durability are affected as well. As shown in FIG. 1, interconnect system is manufactured on conventional low-k IMD system using conventional dual damascene process. The soft SOD layer 112 on a substrate 110, is adjacent to multitude of conductor contacts 114 and interconnect 115, which is porous dielectric and has weak mechanical strength. However, there are some problems, such as via deformation and structure distortion, happening due to the softness characteristic of the low-k SOD layer.

SUMMARY OF THE INVENTION

It is an object of the present invention to provide a method and structure for a semiconductor structure with low dielectric constant inter-metal dielectric. The inter-metal dielectric of the semiconductor structure has low dielectric constant material filled in multitude of interconnect structures between multitude of metal structures.

It is another object of the present invention to provide a method and structure for interconnect system of a semiconductor structure. The interconnect system can provide characteristics of low dielectric constant and enhanced mechanical strength.

It is yet another object of the present invention to provide a method and structure for an inter-metal dielectric of a semiconductor structure. The inter-metal dielectric simultaneously has low-k and oxide-based materials to prevent metal structures from deformation and distortion.

In the present invention, a method is for forming low dielectric constant inter-metal dielectric layer. The method comprises providing a semiconductor substrate and forming a first dielectric layer on the semiconductor substrate. Conductor structures are formed in the first dielectric layer. The partial first dielectric layer is removed by using the conductor structures as etch mask. A second dielectric layer is formed between the conductor structure, which has a dielectric constant smaller than the first dielectric layer. The semiconductor structure comprises a substrate, a first dielectric layer on the substrate, multitude of conductor structures in the first dielectric layer, and multitude of second dielectric structures in the first dielectric layer and between the conductor structures.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the preset invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a method is for forming low dielectric constant inter-metal dielectric layer. The method comprises providing a semiconductor substrate and forming a first dielectric layer on the semiconductor substrate. Conductor structures are formed in the first dielectric layer. The partial first dielectric layer is removed by using the conductor structures as etch mask. A second dielectric layer is formed between the conductor structure, which has a dielectric constant smaller than the first dielectric layer. The semiconductor structure comprises a substrate, a first dielectric layer on the substrate, multitude of conductor structures in the first dielectric layer, and multitude of second dielectric structures in the first dielectric layer and between the conductor structures.

Figure 1:
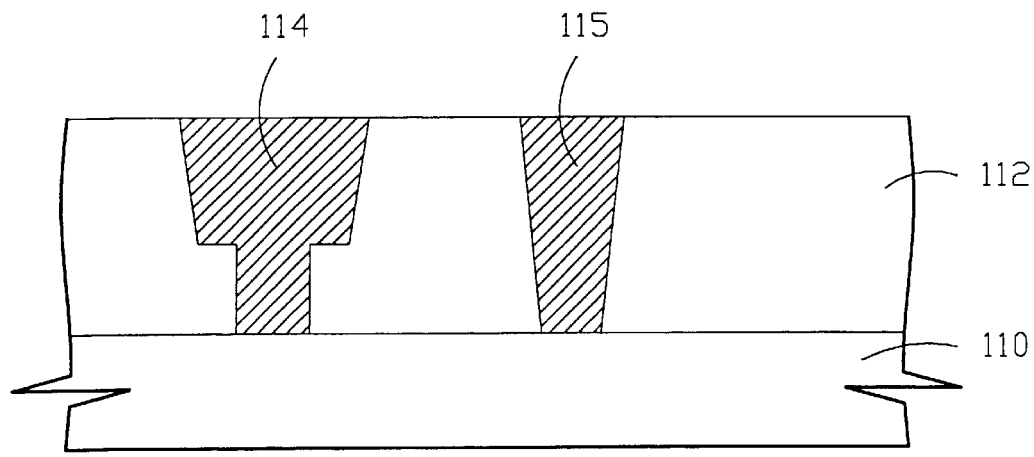
FIG. 1 is a cross-sectional schematic diagram illustrating an low-k IMD system manufactured by using dual damascene process in accordance with the prior art.
Figure 2A:
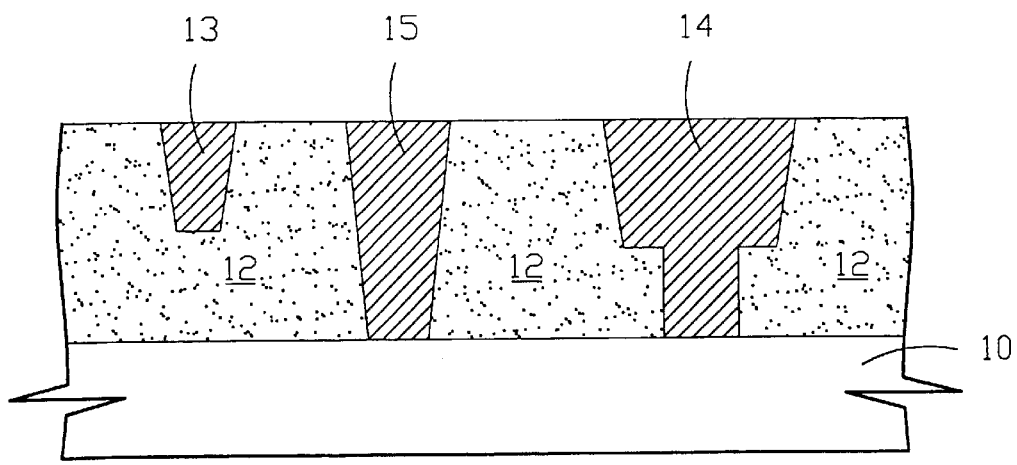
FIGS. 2A–2C are a series of cross-sectional schematic diagrams illustrating IMD system manufactured in accordance with the present invention.
Figure 2B:
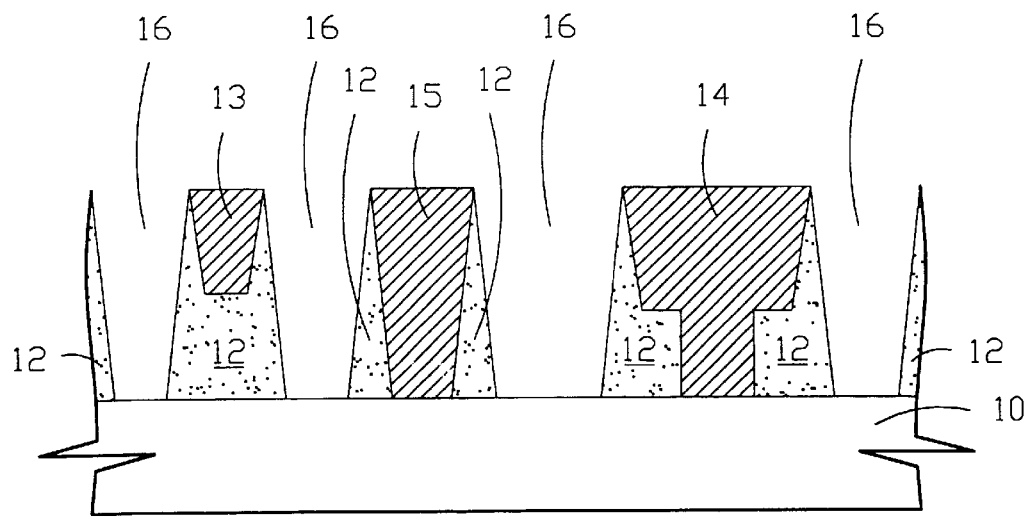
Figure 2C:
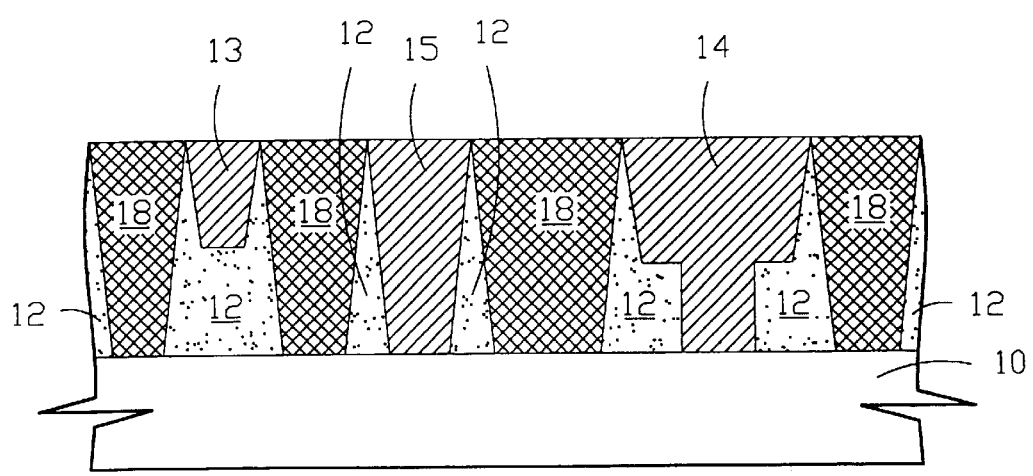

One embodiment of the present invention is depicted in FIGS. 2A–2C, which show a series of cross-sections of an interconnect portion of a semiconductor wafer to form by using the dual damascene process. Multitude of conductor structures, such as contact 13, wiring line 14 and interconnect structure 15, are formed in an oxide-based IMD layer 12 on a substrate 10. In the embodiment, the contacts 13, wiring line 14 and interconnect structure 15 are filled with conductor metal material, such as copper. The oxide-based IMD layer 12 can be undoped silicate glass (USG) films deposited by chemical vapor deposition processing, but may also be a number of other types of films, including fluoro-silicate glass (FSG), phosphorous-doped silicate glass (PSG), boron nitride (BN) and amorphous carbon as well as to films deposited by other deposition techniques. Those materials of oxide-based IMD can provide better mechanical strength for the conductor structures.

Next, as one key step of the present invention shown in FIG. 2B, the oxide-based IMD layer 12 is partially etched away using those conductor structures, such as the contacts 13, wiring line 14 and interconnect structure 15, as self-aligned hard mask. Then some openings 16 between the conductor structures are formed after removing parts of the oxide-based IMD layer 12. To be specific, some parts of the oxide-based IMD layer 12 can be remained on the substrate 10, such as at sidewall of the contact 13. Those residual oxide-based IMD layer 12 can enhance the mechanical strength that may prevent those conductor structures from deformation or distortion.

As depicted in FIG. 2C, those openings 16 between the conductor structures are filled with low-k IMD material, such as spin-on dielectric material, to form multitude of spin-on dielectric structures 18. These spin-on dielectric structures 18 are partially adjacent to both the conductor structures and residual oxide-based IMD. In the present invention, the low-K IMD material in the openings 16 between the conductor structures can provide the characteristic of low-k for the semiconductor device, and simultaneously, the remained oxide-based IMD adjacent to the openings 16 can provide the enhanced mechanical strength for the semiconductor device. Compared with those conventional semiconductor devices having total low-k IMD around the conductor structures, the semiconductor device of the present invention can have better performances in intra-metal capacitance and less impact on RC delay because of its enhanced mechanical strength around the conductor structures and low-k IMD.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor structure with low dielectric constant inter-metal dielectric, said semiconductor structure comprising:

a substrate, a first dielectric layer on said substrate, a plurality of metal structures in said first dielectric layer; and a plurality of second dielectric structures in said first dielectric layer and between said conductor structures, each said second dielectric structure having a dielectric constant smaller than said first dielectric layer.

2. The semiconductor structure of claim 1, wherein said second dielectric structures is made of spin-on dielectric material.

3. The semiconductor structure of claim 1, wherein said first dielectric layer comprises an oxide-based dielectric layer.

4. The semiconductor structure of claim 1, wherein said second dielectric structures are adjacent to said first dielectric layer.

5. The semiconductor structure of claim 1, wherein said conductor structures comprise a contact structure made of metal material.

6. A semiconductor structure with low dielectric constant inter-metal dielectric, said semiconductor structure comprising:

a substrate, a first dielectric layer on said substrate, a plurality of metal structures in said first dielectric layer; and a plurality of spin-on dielectric structures in said first dielectric layer and between said metal structures, each said spin-on dielectric structure having a dielectric constant smaller than said first dielectric layer.

7. The semiconductor structure of claim 6, wherein said spin-on structures are adjacent to said metal structures and said first dielectric layer.

8. The semiconductor structure of claim 6, wherein said spin-on dielectric structures are on said substrate.

* * * * *